United States Patent
Ching et al.

(10) Patent No.: US 9,202,917 B2
(45) Date of Patent: Dec. 1, 2015

(54) BURIED SIGE OXIDE FINFET SCHEME FOR DEVICE ENHANCEMENT

(71) Applicant: Taiwan Semiconductor Manufacturing Co., Ltd., Hsin-Chu (TW)

(72) Inventors: Kuo-Cheng Ching, Zhubei (TW); Chih-Hao Wang, Baoshan Township (TW); Zhiqiang Wu, Chubei (TW); Gwan Sin Chang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 137 days.

(21) Appl. No.: 13/952,753

(22) Filed: Jul. 29, 2013

(65) Prior Publication Data
US 2015/0028426 A1    Jan. 29, 2015

(51) Int. Cl.
*H01L 29/78* (2006.01)
*H01L 29/66* (2006.01)

(52) U.S. Cl.
CPC ........ *H01L 29/785* (2013.01); *H01L 29/66545* (2013.01); *H01L 29/66795* (2013.01); *H01L 29/7849* (2013.01)

(58) Field of Classification Search
CPC ...................................................... H01L 29/785
See application file for complete search history.

(56) References Cited

U.S. PATENT DOCUMENTS

| | | | |
|---|---|---|---|
| 8,362,572 B2 * | 1/2013 | Huang et al. | 257/386 |
| 2006/0076625 A1 | 4/2006 | Lee et al. | |
| 2007/0120156 A1 * | 5/2007 | Liu et al. | 257/288 |
| 2007/0267695 A1 * | 11/2007 | Lee | 257/347 |
| 2009/0278196 A1 * | 11/2009 | Chang et al. | 257/328 |
| 2010/0163971 A1 * | 7/2010 | Hung et al. | 257/327 |
| 2012/0319211 A1 | 12/2012 | van Dal et al. | |
| 2014/0011341 A1 | 1/2014 | Maszara et al. | |
| 2014/0357029 A1 | 12/2014 | Loubet et al. | |
| 2015/0024573 A1 | 1/2015 | Jacob et al. | |

OTHER PUBLICATIONS

Non Final Office Action Dated Feb. 5, 2015 U.S. Appl. No. 13/970,790.
U.S. Appl. No. 13/970,790, filed Aug. 20, 2013. 27 Pages.
English Translation of Korean Office Action dated Dec. 18, 2014 for co-pending Korean Application No. 10-2013-0155659.
U.S. Appl. No. 13/970,295, filed Aug. 19, 2013.
Final Office Action dated Jul. 2, 2015 in connection with U.S. Appl. No. 13/970,790.
Advisory Action Dated Aug. 26, 2015 U.S. Appl. No. 13/970,790.

* cited by examiner

*Primary Examiner* — Lex Malsawma
(74) *Attorney, Agent, or Firm* — Eschweiler & Associates, LLC (57) ABSTRACT

The present disclosure relates to a Fin field effect transistor (FinFET) device having a buried silicon germanium oxide structure configured to enhance performance of the FinFET device. In some embodiments, the FinFET device has a three-dimensional fin of semiconductor material protruding from a substrate at a position located between first and second isolation regions. A gate structure overlies the three-dimensional fin of semiconductor material. The gate structure controls the flow of charge carriers within the three-dimensional fin of semiconductor material. A buried silicon-germanium-oxide (SiGeOx) structure is disposed within the three-dimensional fin of semiconductor material at a position extending between the first and second isolation regions.

20 Claims, 9 Drawing Sheets

BURIED SIGE OXIDE FINFET SCHEME FOR DEVICE ENHANCEMENT

BACKGROUND

As integrated chips continue to decrease in size, limitations in processing capabilities and in fundamental material characteristics have made scaling of planar CMOS transistors increasingly difficult (e.g., due to leakage current and process variations). FinFET (Field effect transistors) devices have long been looked to as a promising alternative to planar CMOS transistors. In recent years, advances in processing technology have made FinFET devices a viable option in emerging technologies (e.g., 22 nm and below).

FinFET devices are three-dimensional structures that have a conducting channel comprising a fin of semiconductor material that rises above a substrate as a three-dimensional structure. A gate structure, configured to control the flow of charge carriers within the conducting channel, wraps around the fin of semiconductor material. For example, in a tri-gate FinFET structure, the gate structure wraps around three sides of the fin of semiconductor material, thereby forming conductive channels on three sides of the fin.

BRIEF DESCRIPTION OF THE DRAWINGS

FIGS. 6A-14 illustrate some embodiments of a semiconductor substrate upon which a method of forming a FinFET device having a buried silicon germanium oxide structure, according to the method of FIG. 5, is performed

FIGS. 16A-18B illustrate some embodiments of a semiconductor substrate upon which a method of forming a semiconductor device having a gate structure with a highly controlled width, according to the method of FIG. 15, is performed.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

In recent years, strain engineering has been used as a means to increase the performance of semiconductor devices. Strain engineering introduces a strain into material within a channel region of a semiconductor device to improve the performance of the device. Strain is often induced by forming a lattice mismatch between materials in the channel region. For example, a lattice mismatch can be formed by depositing a layer of silicon over layer of silicon germanium. The atoms in the silicon layer align with the atoms of the underlying silicon germanium layer (which are arranged further apart), stretching the silicon material. The stretched silicon material reduces interference with the movement of charge carriers, thereby improving mobility within the channel region.

The present disclosure relates to a Fin field effect transistor (FinFET) device having an epitaxial oxide structure configured to enhance performance of the FinFET device. In some embodiments, the FinFET device comprises a three-dimensional fin of semiconductor material protruding from a substrate at a position located between first and second isolation regions. A gate structure overlies the three-dimensional fin of semiconductor material. The gate structure is configured to control the flow of charge carriers within the three-dimensional fin of semiconductor material. A buried epitaxial oxide structure (e.g., a silicon-germanium oxide structure) is disposed within the three-dimensional fin of semiconductor material at a position extending between the first and second isolation regions.

Figure 1A:
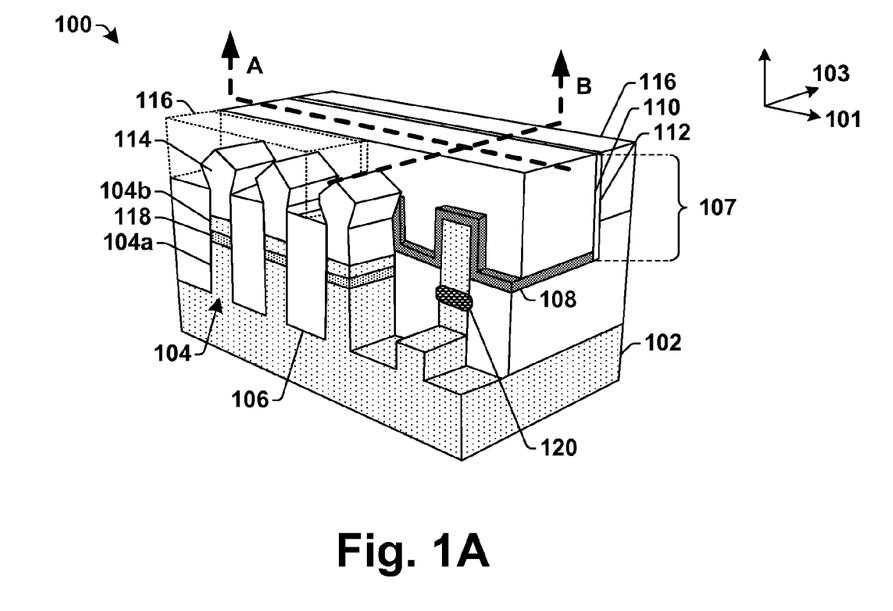
FIGS. 1A-1C illustrate some embodiments of a multi-gate NMOS FinFET device having a buried epitaxial oxide structure.
Figure 1B:
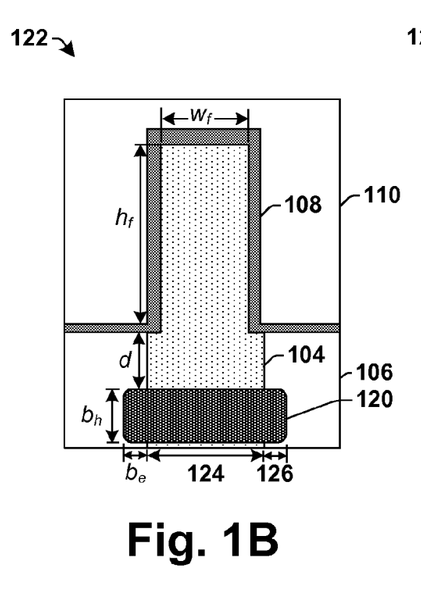
Figure 1C:
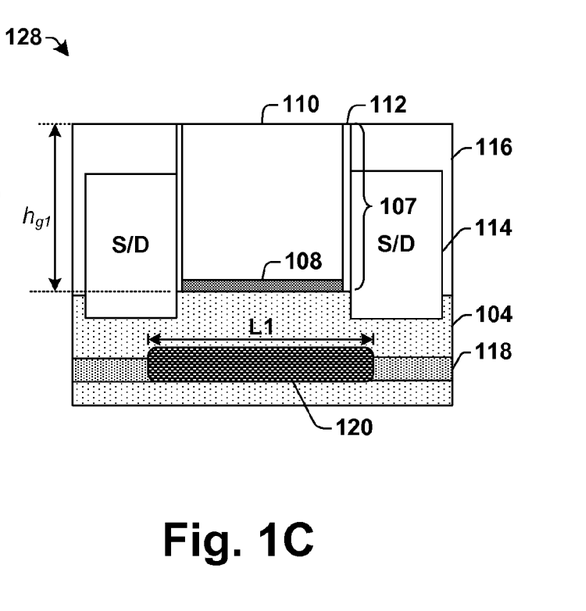

FIGS. 1A-1C illustrate some embodiments of a multi-gate NMOS FinFET device having a buried epitaxial oxide structure 120.

FIG. 1A illustrates a three-dimensional view 100 of the multi-gate NMOS FinFET device.

The NMOS FinFET device comprises three-dimensional fins 104 located over a substrate 102. The three-dimensional fins 104 are separated by isolation regions 106 comprising sections of dielectric material along a first direction 101. The three-dimensional fins 104 extend between source and drain regions 114 disposed within a dielectric layer 116 (e.g., an inter-level dielectric material), along a second direction 103 perpendicular to the first direction 101.

In various embodiments, the substrate 102 may comprise any type of semiconductor body (e.g., silicon, silicon-germanium, silicon-on-insulator, etc.) such as a semiconductor wafer and/or one or more die on a semiconductor wafer, as well as any other type of semiconductor and/or epitaxial layers associated therewith. The three-dimensional fins 104 comprise a semiconductor material, which protrudes outward from the substrate 102 as positive reliefs.

A gate structure 107, comprising a three-dimensional structure protruding as a second fin, is disposed over the substrate 102 at a position that straddles the three-dimensional fins 104. The gate structure 107 is configured to control the flow of charge carriers in a channel region within the three-dimensional fins 104. The gate structure 107 comprises a gate dielectric layer 108 and a gate material layer 110 separated from the three-dimensional fins 104 by the gate dielectric layer 108. In various embodiments, the gate dielectric layer 108 may comprise a silicon dioxide (e.g., $SiO_2$) layer or a high-k dielectric layer. In various embodiments, the gate material layer 110 may comprise a poly-silicon layer or a metal gate layer (e.g., aluminum, aluminum oxide, etc.). In some embodiments, sidewalls spacers 112 may be located on opposing sides of the gate structure 107.

A buried epitaxial structure 118 and a buried epitaxial oxide structure 120 are disposed within the three-dimensional fins 104. The buried epitaxial oxide structure 120 comprises an oxidized part or whole of an epitaxial structure 118. In some embodiments, the buried epitaxial structure 118 comprises a buried silicon germanium (SiGe) structure and the buried epitaxial oxide structure 120 comprises a buried silicon germanium oxide (SiGeOx) structure. In other embodiments, the buried epitaxial structure 118 comprises a buried germanium (Ge) structure and the buried epitaxial oxide structure 120 comprises a buried germanium oxide (GeOx) structure The buried epitaxial structure 118 and the buried epitaxial oxide structure 120 are located above a first portion of the three dimensional fin 104a. In some embodiments, the buried epitaxial structure 118 and the buried epitaxial oxide structure 120 may further be positioned below a second portion of the three dimensional fin 104b. The buried epitaxial structure 118 is positioned at a location underlying the source and drain regions 114. The buried epitaxial oxide structure 120 is positioned at a location underlying the gate structure 107.

The buried epitaxial structure 118 and the buried epitaxial oxide structure 120 are configured to introduce a strain into the three-dimensional fins 104, which improves device performance. For example, the buried epitaxial oxide structure 120 may have a lattice mismatch with the overlying second portion of the three-dimensional fin 104b, which induces a tensile strain into an overlying channel region within the second portion of the three-dimensional fin 104b. The buried epitaxial oxide structure 120 is configured to induce a greater tensile stress to the channel region than a strain induced by the epitaxial structure 118.

FIG. 1B illustrates a cross-sectional view 122 of NMOS FinFET device shown in three-dimensional view 100 along a first cross-sectional line A. As shown in cross-sectional view 122, the buried epitaxial oxide structure 120 (e.g., the buried silicon germanium oxide structure) is located within the three-dimensional fins 104 at a position between the isolation regions 106 (e.g., sections of dielectric material) located on opposing sides of the buried epitaxial oxide structure 120.

In some embodiments, the three-dimensional fins 104 may have a width $w_f$ that is between approximately 4 nm (nanometers) and approximately 10 nm. In some embodiments, the three-dimensional fins 104 may have a height $h_f$ that is between approximately 20 nm and approximately 40 nm. The buried epitaxial oxide structure 120 has a height $b_h$ that is between approximately 3 nm and approximately 30 nm and is separated from the gate dielectric layer 108 by a distance d that is between approximately 5 nm and approximately 30 nm.

In some embodiments, the buried epitaxial oxide structure 120 extends outward from sidewalls of the three-dimensional fin 104 as a bulge that causes an outer edge of the buried epitaxial oxide structure 120 to be embedded within the isolation regions 106. For example, the epitaxial oxide structure 120 may extend laterally past the sidewalls of the three-dimensional fin 104 by a distance $b_e$ of between 1 nm and 5 nm. In some embodiments, the height of the buried epitaxial oxide structure 120 may be larger in regions 126 outside of the three-dimensional fin 104 relative to regions 124 inside of the three-dimensional fin 104. For example, the buried epitaxial oxide structure 120 may have a height of 20 nm in a first region 124 within the three-dimensional fin 104 and a height of 30 nm in a second region 126 outside of the three-dimensional fin 104.

FIG. 1C illustrates a cross-sectional view 128 of NMOS FinFET device shown in three-dimensional view 100 along a second cross-sectional line B. As shown in cross-sectional view 128, the buried epitaxial oxide structure 120 is located below the gate structure 107, which has a height $h_{g1}$. The buried epitaxial oxide structure 120 underlies a conductive channel that extends between source and drain regions 114. The buried epitaxial oxide structure 120 is disposed between buried epitaxial structures 118 located on opposing sides of the buried epitaxial oxide structure 120. In some embodiments, the epitaxial oxide structure 120 may have a length L1 that is greater than a length of the conductive channel.

Figure 2A:
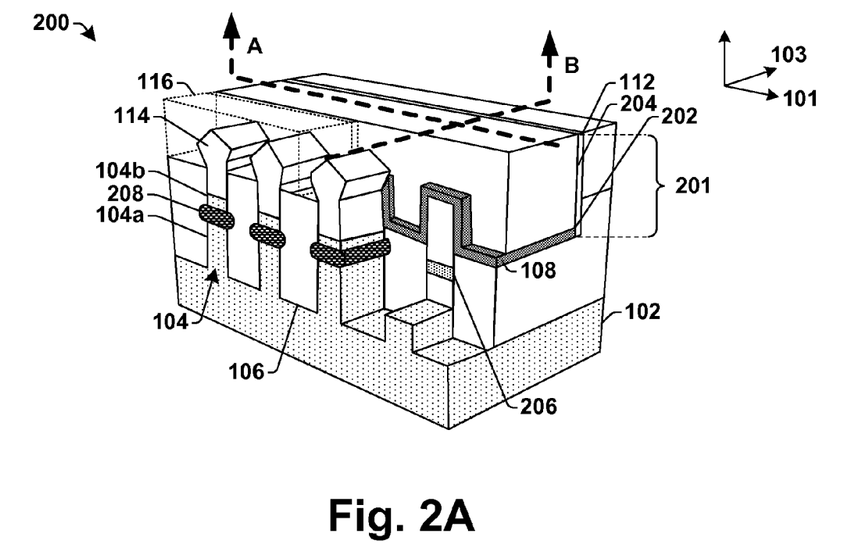
FIGS. 2A-2C illustrate some embodiments of a multi-gate PMOS FinFET device having a buried epitaxial oxide structure.
Figure 2B:
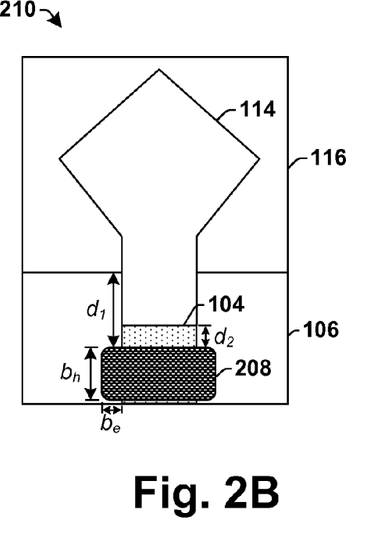
Figure 2C:
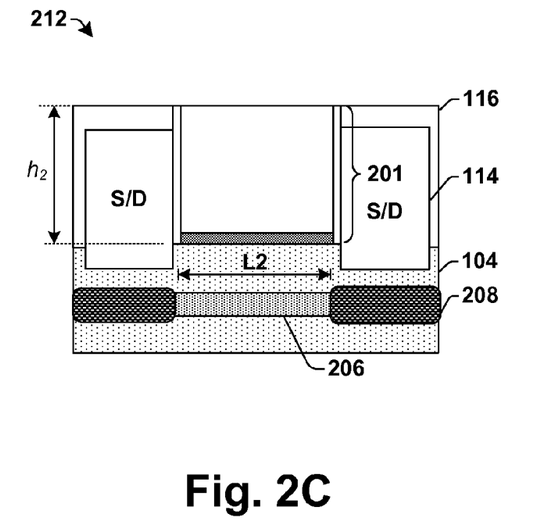

FIGS. 2A-2C illustrate some embodiments of a multi-gate PMOS FinFET device having a buried epitaxial oxide structure 208.

FIG. 2A illustrates a three-dimensional view 200 of the multi-gate PMOS FinFET device.

The PMOS FinFET device comprises three-dimensional fins 104 located over a substrate 102 and separated by isolation regions 106 comprising sections of dielectric material along a first direction 101. The three-dimensional fins 104 extend between source and drain regions 114 disposed within a dielectric layer 116 (e.g., an inter-level dielectric material), along a second direction 103 perpendicular to the first direction 101. A gate structure 201, comprising a gate dielectric layer 202 and a gate material 204, is disposed over the substrate 102 at a position that straddles the three-dimensional fins 104. The gate structure 201 is configured to control the flow of charge carriers within the three-dimensional fins 104. In various embodiments, the gate dielectric layer 202 may comprise a silicon dioxide (e.g., $SiO_2$) layer or a high-k dielectric layer. The gate material 204, separated from the three-dimensional fins 104 by the gate dielectric layer 202, may comprise a poly-silicon layer or a metal gate layer (e.g., aluminum, aluminum oxide, etc.). In some embodiments, sidewalls spacers 112 may be located on opposing sides of the gate structure 201.

A buried epitaxial structure 206 and a buried epitaxial oxide structure 208 are disposed within the three-dimensional fins 104. The buried epitaxial oxide structure 208 comprises an oxidized part or whole of an epitaxial structure 206. In some embodiments, the buried epitaxial structure 206 comprises a buried silicon germanium (SiGe) structure and the buried epitaxial oxide structure 208 comprises a buried silicon germanium oxide (SiGeOx) structure. In other embodiments, the buried epitaxial structure 206 comprises a buried germanium (Ge) structure and the buried epitaxial oxide structure 208 comprises a buried germanium oxide (GeOx) structure The buried epitaxial structure 206 and the buried epitaxial oxide structure 208 are located above a first portion of the three-dimensional fin 104a. In some embodiments, the buried epitaxial structure 206 and the buried epitaxial oxide structure 208 may further be positioned below a second portion of the three dimensional fin 104b. The buried epitaxial structure 206 is positioned at a location underlying the gate structure 201. The buried epitaxial oxide structure 208 is positioned at a location underlying the source and drain regions 114.

The buried epitaxial structure 206 and the buried epitaxial oxide structure 208 are configured to introduce a strain into the three-dimensional fins 104, which improves device performance. For example, the buried epitaxial oxide structure 208 may have a lattice mismatch with the overlying second portion of the three-dimensional fin 104b, which induces a compressive strain into an overlying channel region within the second portion of the three-dimensional fin 104b. The buried epitaxial oxide structure 208 is configured to induce a greater compressive stress to the channel region than a strain induced by the epitaxial structure 206.

FIG. 2B illustrates a cross-sectional view 210 of PMOS FinFET device shown in three-dimensional view 200 along a first cross-sectional line A. As shown in cross-sectional view 210, the buried epitaxial oxide structure 208 (e.g., the buried silicon germanium oxide structure) is vertically located below a source and/or a drain region 114 of the semiconductor device. The buried epitaxial oxide structure 208 is laterally located between isolation regions 106 located on opposing sides of the buried epitaxial oxide structure 208.

In some embodiments, the buried epitaxial oxide structure 208 has a height $b_h$ that is between approximately 3 nm and approximately 30 nm and is separated from the gate dielectric layer 108 by a distance d that is between approximately 5 nm and approximately 30 nm. In some embodiments, the buried epitaxial oxide structure 208 extends outward from sidewalls of the three-dimensional fin 104 by a distance $b_e$ of between 1 nm and 5 nm.

FIG. 2C illustrates a cross-sectional view 212 of PMOS FinFET device shown in three-dimensional view 200 along a second cross-sectional line B. As shown in cross-sectional view 212, the buried epitaxial structure 206 is located below the gate structure 201, which has a height $h_{g2}$. In some embodiments, height $h_{g2}$ is less than height $h_{g1}$ (shown in FIG. 1C). In other embodiments, height $h_{g2}$ is substantially equal to height $h_{g1}$.

The buried epitaxial structure 206 underlies a conductive channel that extends between source and drain regions 114. The buried epitaxial structure 206 is disposed between buried epitaxial oxide structures 208 located on opposing sides of the buried epitaxial structure 206. In some embodiments, the buried epitaxial structure 206 may have a length L2 that is less than or equal to a length of the conductive channel.

Figure 3:
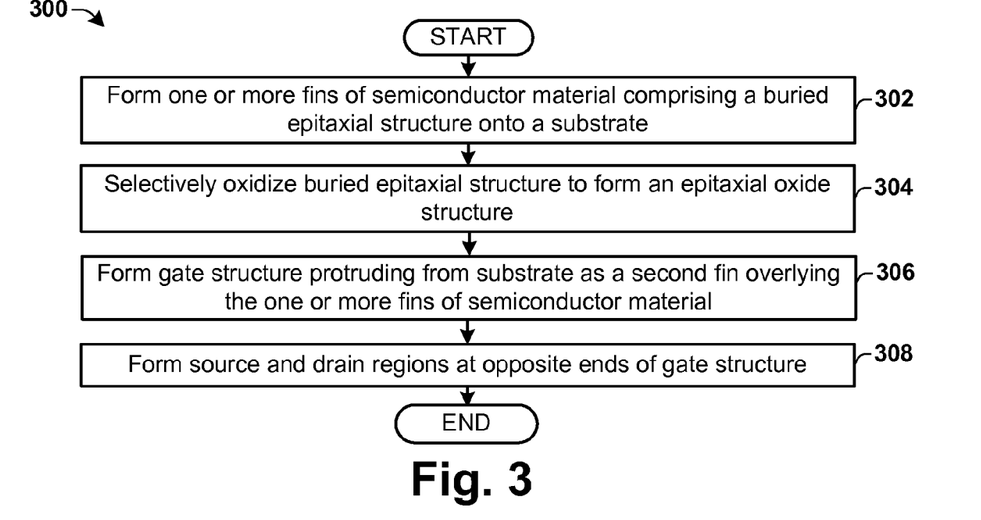
FIG. 3 illustrates a flow chart of some embodiments of a method of forming a FinFET device having a buried epitaxial oxide structure.

FIG. 3 illustrates a flow chart of some embodiments of a method 300 of forming a FinFET device having buried epitaxial oxide structures.

At 302, one or more fins of semiconductor material, comprising a buried epitaxial structure (e.g., a buried silicon germanium structure), are formed onto a substrate. In some embodiments, one or more fins of semiconductor material are separated by isolation regions comprising sections of dielectric material, so that the isolation regions are interleaved between the sections of semiconductor material.

At 304, the buried epitaxial structures are selectively oxidized to form a buried epitaxial oxide structures (e.g., a buried silicon germanium oxide structure). In some embodiments, the buried epitaxial structures may be selectively oxidized by way of a thermal oxidation process over selective areas of a substrate. The oxidation procedure expands the epitaxial structure, causing the epitaxial oxide structure to expand laterally.

At 306, a gate structure protruding as a second three-dimensional fin overlying the one or more fins of semiconductor material is formed. The gate structure may be formed by selectively depositing a gate dielectric layer using a first deposition process and selectively depositing a gate material layer using a second deposition process.

At 308, source and drain regions are formed at opposite ends of the gate structure. In some embodiments, the source region and the drain region are formed by epitaxial growth of a doped semiconductor material within the source and drain recesses within the one or more fins of semiconductor material.

It will be appreciated that the disclosed buried epitaxial oxide structures (e.g., buried silicon germanium oxide structures) may have varying forms depending upon one or more parameters of the oxidation process. For example, as the time and/or the temperature of the oxidation process increases, the amount of silicon germanium oxidized increases.

FIGS. 4A-4D illustrates some embodiments of exemplary buried silicon germanium oxide structures that may be disposed within a FinFET device. It will be appreciated that the disclosed buried silicon germanium oxide structure are not limited by the examples of FIGS. 4A-4D, but rather the examples of FIGS. 4A-4D are intended to illustrates some possible buried silicon germanium oxide structures.

Figure 4A:
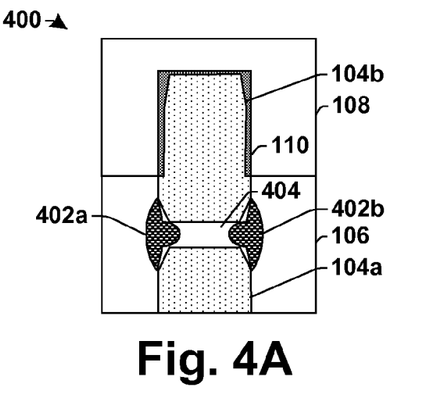
FIGS. 4A-4D illustrate some embodiments of cross-sectional views illustrating buried silicon germanium oxide structures.

FIG. 4A illustrates some embodiments of a cross-sectional view 400 of a first example of a buried silicon germanium oxide structure 402.

The buried silicon germanium oxide structure 402 is discontinuous between a first sidewall of a three-dimensional fin 104 and a second sidewall of the three-dimensional fin 104, opposite the first sidewall. The buried silicon germanium oxide structure 402 comprises a first buried silicon germanium oxide structure section 402a and a second buried silicon germanium oxide structure section 402b, separated by a silicon-germanium (SiGe) structure 404 configured between a lower portion of the three-dimensional fin 104a and an upper portion of the three-dimensional fin 104b.

Figure 4B:
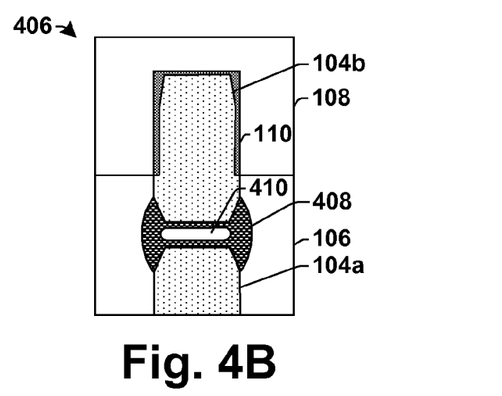

FIG. 4B illustrates some embodiments of a cross-sectional view 406 of a second example of a buried silicon germanium oxide structure 408.

The buried silicon germanium oxide structure 408 extends continuously between a first sidewall of a three-dimensional fin 104 and a second sidewall of the three-dimensional fin 104, opposite the first sidewall. A silicon-germanium (SiGe) structure 410 is embedded within the buried silicon germanium oxide structure 402 at a position between a lower portion of the three-dimensional fin 104a and an upper portion of the three-dimensional fin 104b. The silicon-germanium (SiGe) structure 410 comprises an oval shape having a length (e.g., extending between sidewalls of the fin) that is larger than a height.

Figure 4C:
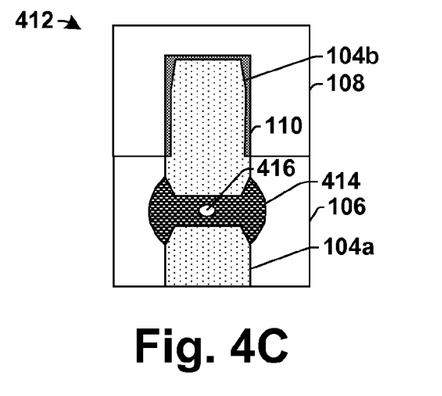

FIG. 4C illustrates some embodiments of a cross-sectional view 412 of a third example of a buried silicon germanium oxide structure 414.

The buried silicon germanium oxide structure 414 extends continuously between a first sidewall of a three-dimensional fin 104 and a second sidewall of the three-dimensional fin 104, opposite the first sidewall. A silicon-germanium (SiGe) structure 416 is embedded within the buried silicon germanium oxide structure 402 at a position between a lower portion of the three-dimensional fin 104a and an upper portion of the three-dimensional fin 104b. The silicon-germanium (SiGe) structure 416 comprises a substantially circular shape.

Figure 4D:
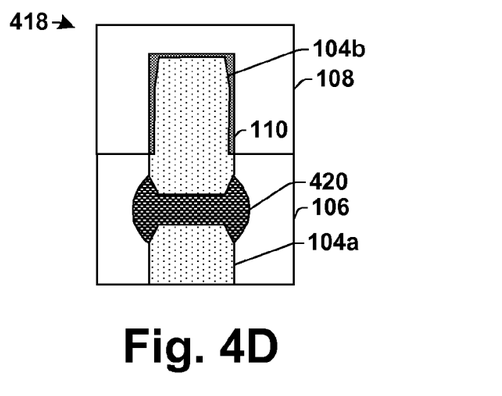

FIG. 4D illustrates some embodiments of a cross-sectional view 418 of a fourth example of a buried silicon germanium oxide structure 420. The buried silicon germanium oxide structure 420 extends continuously, as a solid structure, between a first sidewall of a three-dimensional fin 104 and a second sidewall of the three-dimensional fin 104, opposite the first sidewall.

Figure 5:
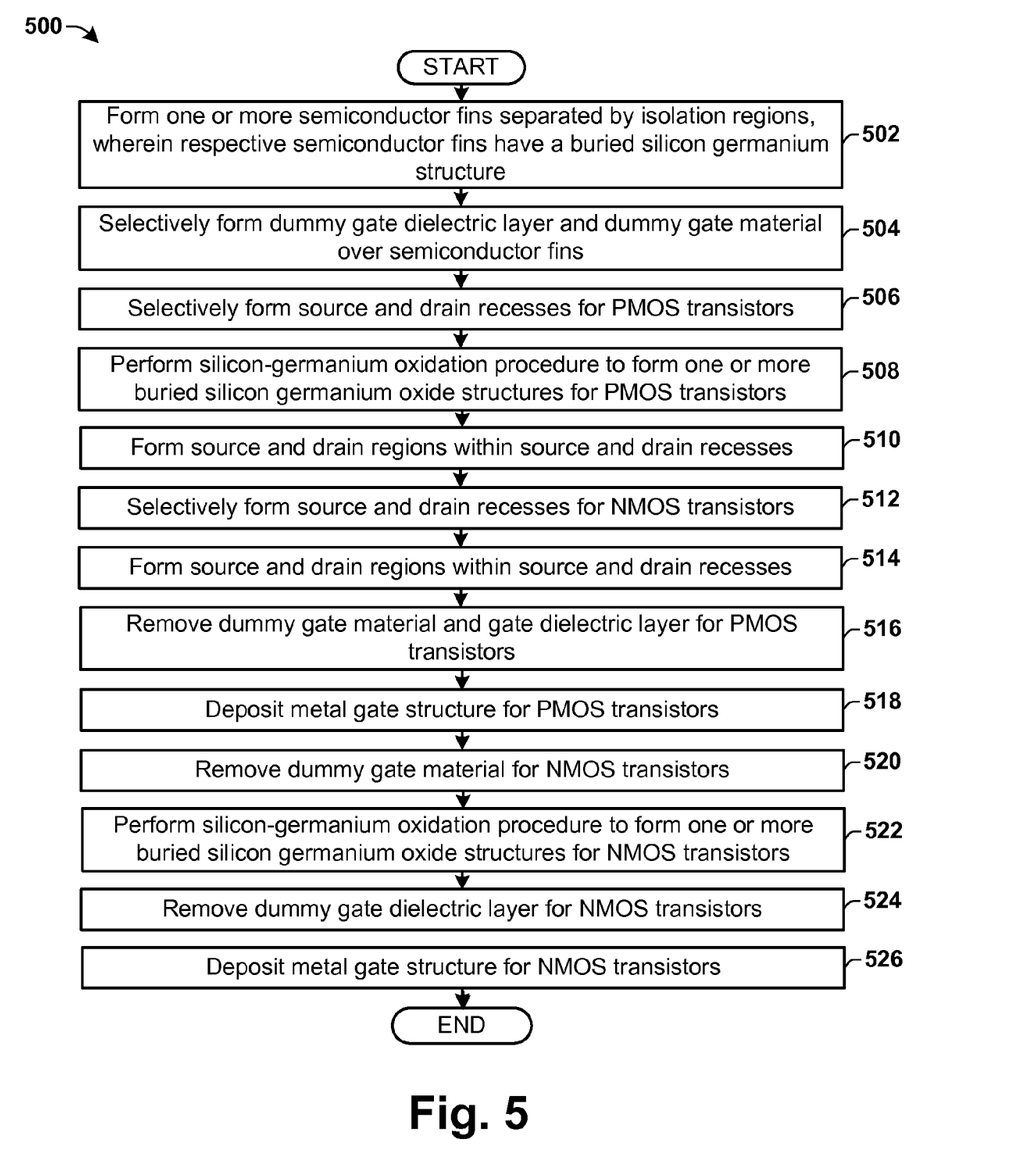
FIG. 5 illustrates a flow chart of some embodiments of a more detailed method of forming a FinFET device having a buried silicon germanium oxide structure.

FIG. 5 illustrates a flow chart of some embodiments of a method 500 of forming NMOS and PMOS FinFET devices having buried silicon germanium structures.

While the disclosed methods (e.g., methods 300, 500, and 1500) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, one or more fins of semiconductor material, respectively comprising an epitaxially grown buried silicon germanium structure, are formed onto a substrate.

At 504, a dummy gate dielectric layer and dummy gate material are selectively formed over the semiconductor fins.

At 506, source and drain recesses are selectively formed in the three-dimensional fins for PMOS transistors.

At 508, a silicon-germanium oxidation procedure is performed for PMOS transistors. The silicon germanium oxidation procedure causes the buried silicon germanium structure to be oxidized to form one or more buried silicon germanium oxide structures within PMOS transistors.

At 510, source and drain regions are formed within source and drain recesses.

At 512, source and drain recesses are selectively formed in the three-dimensional fins for NMOS transistors.

At 514, source and drain regions are formed within source and drain recesses.

At 516, the dummy gate material and the dummy gate dielectric layer are removed for PMOS transistors.

At 518, a metal gate structure is selectively deposited for PMOS transistors.

At 520, the dummy gate material is removed for NMOS transistors.

At 522, a silicon-germanium oxidation procedure is performed for NMOS transistors. The silicon germanium oxidation procedure causes the buried silicon germanium structure to be oxidized to form one or more buried silicon germanium oxide structures within NMOS transistors.

At 524, the dummy gate dielectric layer is removed for NMOS transistors.

At 526, a metal gate structure is selectively deposited for NMOS transistors.

FIGS. 6A-14 illustrate some embodiments of a semiconductor substrate upon which a method of forming NMOS and PMOS FinFET devices having buried silicon germanium structures, according to the method 500, is performed. The figures ending with a suffix of A relate to the formation of an NMOS FinFET, while the figures ending with a suffix B relate to the formation of a PMOS FinFET.

Although FIGS. 6A-14 are described in relation to method 500, it will be appreciated that the structures disclosed in FIGS. 6A-14 are not limited to such a method. Rather, it will be appreciated that the illustrated structures of FIGS. 6A-14 provide for a structural description of FinFET devices that is able to stand alone independent of a method.

Figure 6A:
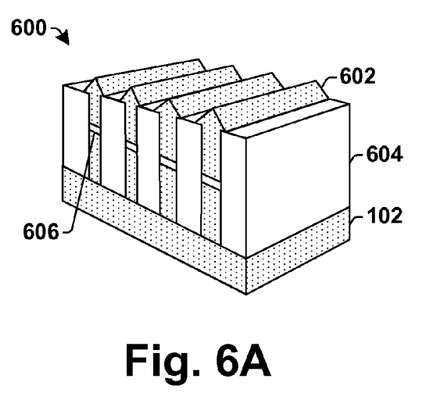
Figure 6B:
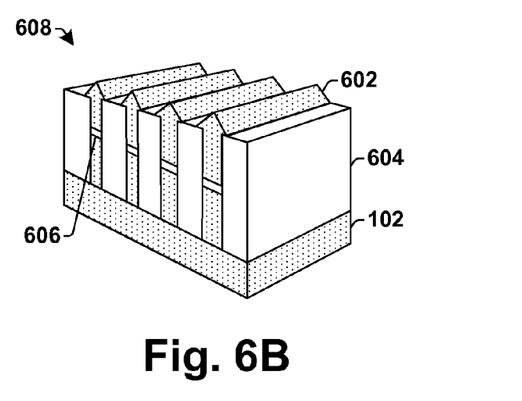

FIGS. 6A-6B illustrate cross-sectional views, 600 and 608, of some embodiments of a substrate corresponding to act 502. As shown in three-dimensional views, 600 and 608, the substrate comprises sections of semiconductor material 602 that protrude outward from a substrate 102. The sections of semiconductor material 602 are separated by sections of dielectric material 604, so that the sections of dielectric material 604 are interleaved between the sections of semiconductor material 602. Respective sections of semiconductor material 602 comprise epitaxial silicon germanium regions disposed within the sections of semiconductor material 602.

Figure 7A:
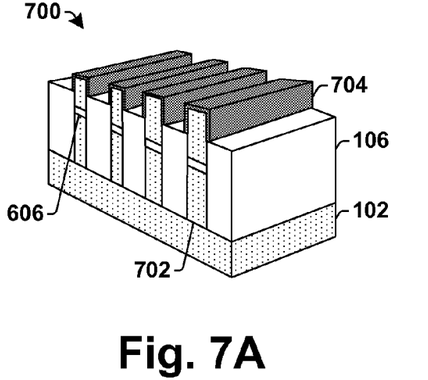
Figure 7B:
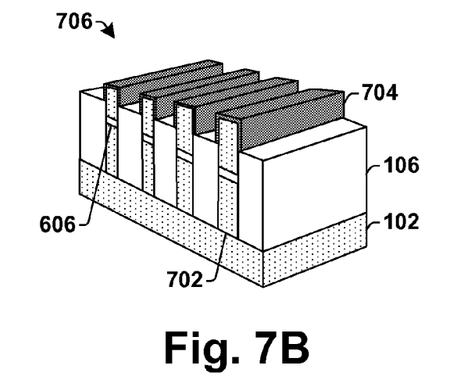

FIGS. 7A-7B illustrate cross-sectional views, 700 and 706, of some embodiments of a substrate corresponding to act 504. As shown in three-dimensional view, 700 and 708, the dielectric material 604 is etched back so that the sections of semiconductor material protrude as one or more three-dimensional fins 702 of semiconductor material above the isolation regions 106 formed from the sections of dielectric material 604. In some embodiments, the isolation regions 106 may be formed by etching the dielectric material 604 using a wet or dry etchant.

Figure 8A:
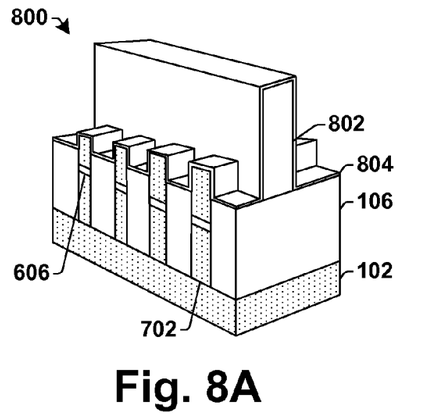
Figure 8B:
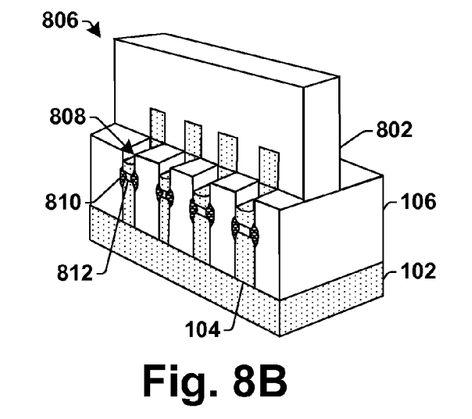

FIGS. 8A-8B illustrate cross-sectional views, 800 and 806, of some embodiments of a substrate corresponding to acts 506-508. As shown in cross-sectional views, 800 and 806, a dummy gate material 802 is formed over the three-dimensional fins 702 of semiconductor material. In some embodiments, sidewalls spacers (not shown) may be formed on opposing sides of the dummy gate material 802.

As shown in cross-sectional view 800 a first hard mask layer 804 is formed over the NMOS transistor. In some embodiments, the first hard mask layer 804 may comprise silicon nitride (SiN). The first hard mask layer 804 prevents processing of the NMOS transistor.

As shown in cross-sectional view 806, the three-dimensional fins 702 of semiconductor material are selectively etched to form recesses 808 in source and drain regions for PMOS transistors. Formation of the recesses 808 may be performed using one or more etching processes comprising a dry etching process and/or a wet etching process. For example, in some embodiments, the etching process may use a wet etchant comprising carbon tetrafluoride ($CF_4$), hydrogen flouride (HF), tetramethylammonium hydroxide (TMAH), potassium hydroxide (KOH), ethylene diamine pyrocatechol (EDP), etc.

A silicon-germanium oxidation procedure is performed for PMOS transistors to form a buried silicon germanium oxide structure 814. In some embodiments, the oxidation process comprises a wet oxidation process in an environment having an $H_2O$ steam. In some embodiments, the $H_2O$ steam comprises a water vapor pressure having a range of between approximately 1 atmosphere and approximately 20 atmospheres. The wet oxidation process may be performed at a temperature of between approximately 400° C. and approximately 600° C. for a time of between approximately 10 minutes and approximately 60 minutes. Depending on the oxidation procedure, in some embodiments, the buried silicon germanium oxide structure 810 comprises sections of silicon germanium oxide separated by a buried silicon germanium structure 812.

Figure 9A:
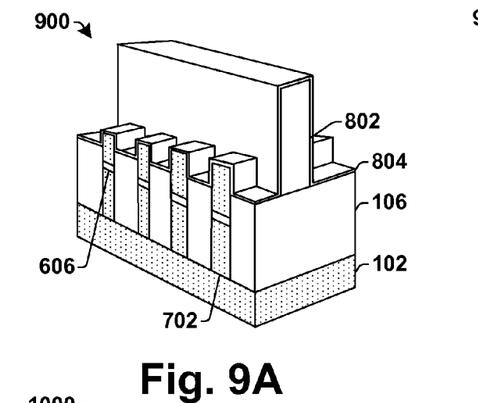
Figure 9B:
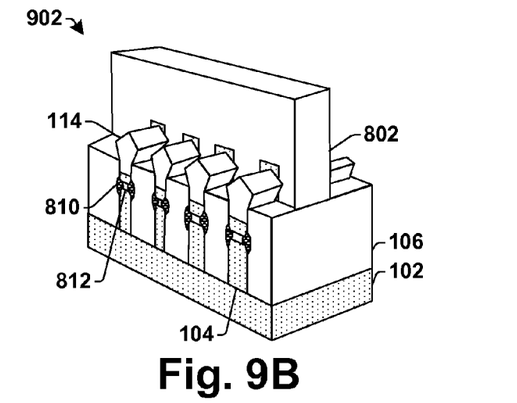

FIGS. 9A-9B illustrate cross-sectional views, 900 and 902, of some embodiments of a substrate corresponding to act 510.

As shown in cross-sectional view 900, the first hard mask layer 804 prevents processing of the NMOS transistor. As shown in cross-sectional view 902, source and drain regions 114 are formed within the recesses 808. In some embodiments, the source and drain regions 114 can be formed by a CDE process comprising chemical vapor deposition (CVD), low pressure CVD (LPCVD), atomic layer CVD (ALCVD), ultrahigh vacuum CVD (UHVCVD), reduced pressure CVD (RPCVD), molecular beam epitaxy (MBE) processes, etc.

In some embodiments, the source and drain regions 114 may comprise epitaxial material grown within the source and drain regions 114. For example, the epitaxial material may comprise silicon, silicon-germanium (SiGe), silicon-carbide (SiC), etc. In some embodiments, the epitaxial material may comprise a silicon-containing material disposed in-situ. By using the in-situ doping process, the dopant concentration (or level) of the silicon-containing material can be desirably controlled and achieved.

Figure 10A:
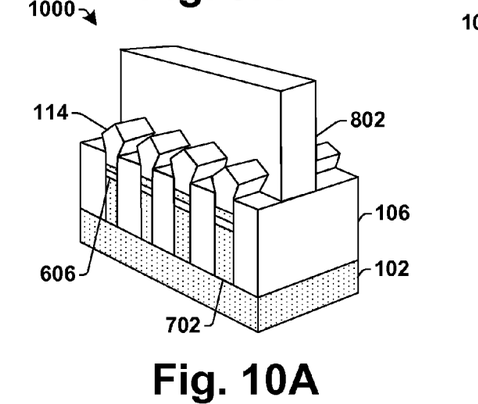
Figure 10B:
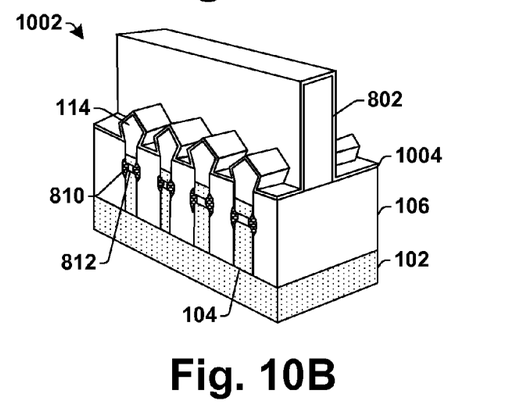

FIGS. 10A-10B illustrates a cross-sectional views, 1000 and 1002, of some embodiments of a substrate corresponding to acts 512-514.

As shown in cross-sectional view 1000, the three-dimensional fins 702 are selectively etched to form recesses in source and drain regions for NMOS transistors. Source and drain regions 114 are subsequently formed within the recesses. As shown in cross-sectional view 1002 a second hard mask layer 1004 is formed over the PMOS transistor. In some embodiments, the second hard mask layer 1004 may comprise silicon nitride (SiN). The second hard mask layer 1004 prevents processing of the PMOS transistor.

Figure 11A:
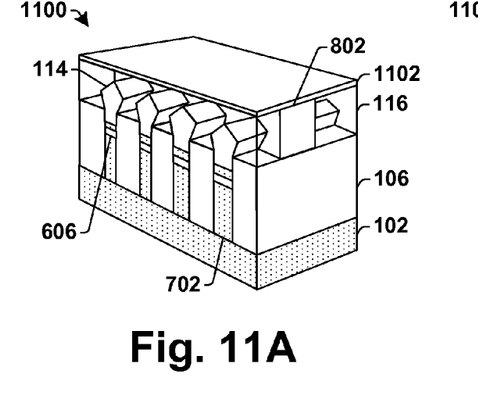
Figure 11B:
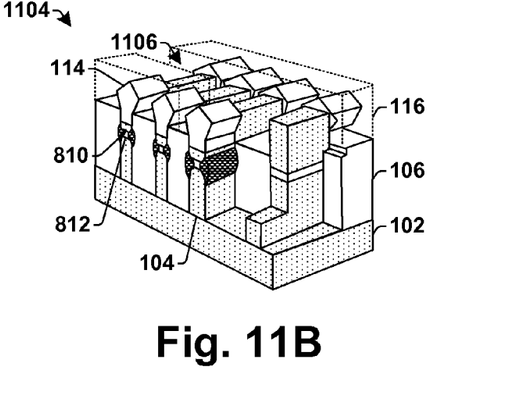

FIGS. 11A-11B illustrates cross-sectional views, 1100 and 1104, of some embodiments of a substrate corresponding to act 516.

As shown in cross-sectional views, 1100 and 1104, an inter-level dielectric (ILD) layer 116 is formed onto the substrate. In some embodiments the ILD layer 116 may comprise an oxide, a low-k dielectric material, or an ultra low-k dielectric material.

As shown in cross-sectional 1100, a third hard mask layer 1102 is formed over the NMOS transistor. In some embodiments, the third hard mask layer 1102 may comprise silicon nitride (SiN). The third hard mask layer 1102 prevents processing of the NMOS transistor.

As shown cross-sectional 1104, the dummy gate material 802 and the dummy gate dielectric layer 704 are removed forming a recess 1106. In various embodiments, the dummy gate material 802 and the dummy gate dielectric layer 704 are removed by a wet chemical etch and/or a dry chemical etch, which utilize an isotropic etch profile.

Figure 12A:
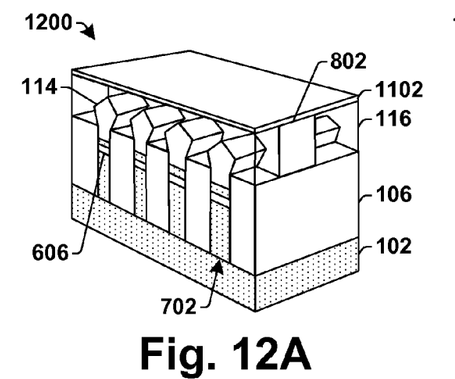
Figure 12B:
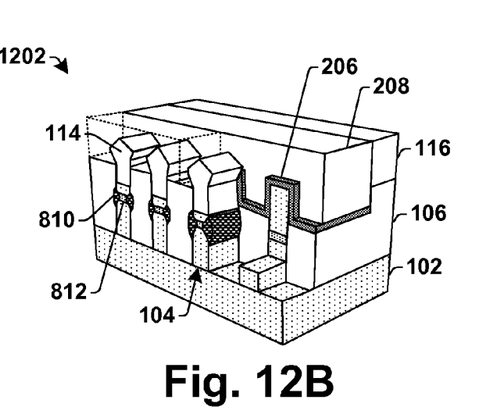

FIGS. 12A-12B illustrates cross-sectional views, 1200 and 1202, of some embodiments of a substrate corresponding to act 518.

As shown in cross-sectional views 1200 the third hard mask layer 1102 prevents processing of the NMOS transistor. As shown in cross-sectional 1202, a gate dielectric layer 108 and a gate material layer 110 are formed within the recess 1106. The gate material layer 110 may be formed by way of a multi step deposition process that forms a first gate material layer and then a second gate material layer. A first chemical mechanical polishing process may be performed after formation of the gate dielectric layer 108 and a gate material layer 110 to remove excess of the gate material layer 110 from the substrate.

In some embodiments, a single strain inducing or high mobility layer (i.e., single lattice) may be formed above the gate material layer 110. In some embodiments, the gate dielectric layer 108 may comprise silicon dioxide, formed by a thermal process or by a deposition process. In other embodiments, the gate dielectric layer 108 may comprise a high-k dielectric layer such as hafnium oxide ($HfO_2$), $TiO_2$, HfZrO, $Ta_2O_3$, $HfSiO_4$, $ZrO_2$, $ZrSiO_2$, etc., formed by a deposition technique (e.g., atomic layer deposition (ALD)). In some embodiments, the gate material layer 110 may comprise a metal (e.g., aluminum) formed using a deposition technique.

Figure 13A:
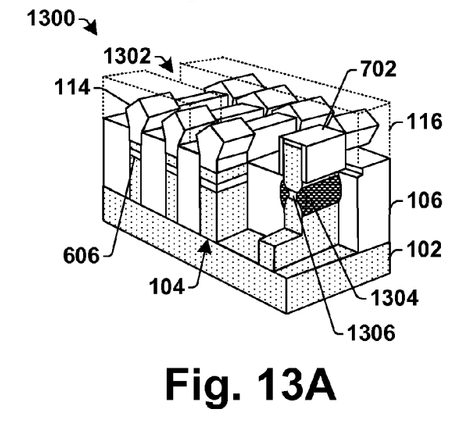
Figure 13B:
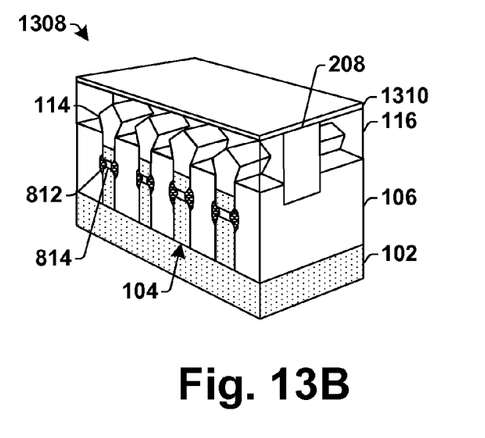

FIGS. 13A-13B illustrates a cross-sectional views, 1300 and 1304, of some embodiments of a substrate corresponding to acts 520-522.

As shown cross-sectional 1300, the dummy gate material 802 is removed from the NMOS transistors, forming a recess 1302. In various embodiments, the dummy gate material 802 is removed by a wet chemical etch and/or a dry chemical etch, which utilize an isotropic etch profile.

A silicon-germanium oxidation procedure is performed for NMOS transistors to form a buried silicon germanium oxide structure 1304. In some embodiments, the oxidation process comprises a wet oxidation process in an environment having an $H_2O$ steam. In some embodiments, the $H_2O$ steam comprises a water vapor pressure having a range of between approximately 1 atmosphere and approximately 20 atmosphere. The wet oxidation process may be performed at a temperature of between approximately 400° C. and approximately 600° C. for a time of between approximately 10 minutes and approximately 60 minutes. Depending on the oxidation procedure, in some embodiments, the buried silicon germanium oxide structure 1304 comprises sections of silicon germanium oxide separated by a buried silicon germanium structure 1306.

As shown in cross-sectional 1308, a fourth hard mask layer 1310 is formed over the PMOS transistor. In some embodiments, the fourth hard mask layer 1310 may comprise silicon nitride (SiN). The fourth hard mask layer 1310 prevents processing of the PMOS transistor.

Figure 14A:
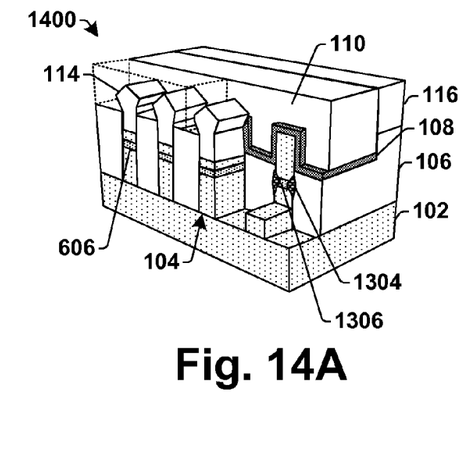
Figure 14B:
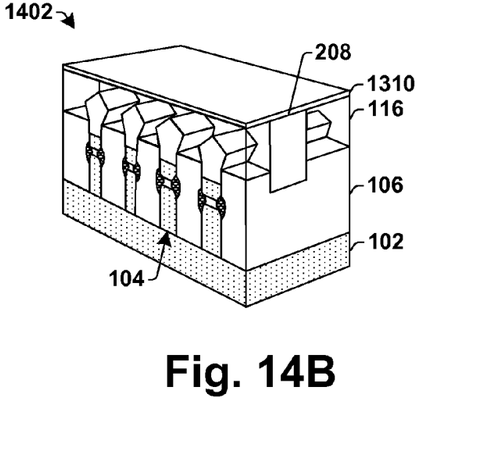

FIGS. 14A-14B illustrate cross-sectional views, 1400 and 1402, of some embodiments of a substrate corresponding to acts 522-524.

As shown in cross-sectional 1400, a gate dielectric layer 108 and a gate material layer 110 are formed within the recess 1302. As shown in cross-sectional views 1402 the fourth hard mask layer 1310 prevents processing of the PMOS transistor.

A second chemical mechanical polishing process may be performed after formation of the gate dielectric layer 108 and a gate material layer 110 to remove excess of the gate material layer 110 from the substrate. The second chemical mechanical polishing process reduces a height of the PMOS metal gate structure to a second height that is less than the height of the NMOS metal gate structure.

Figure 15:
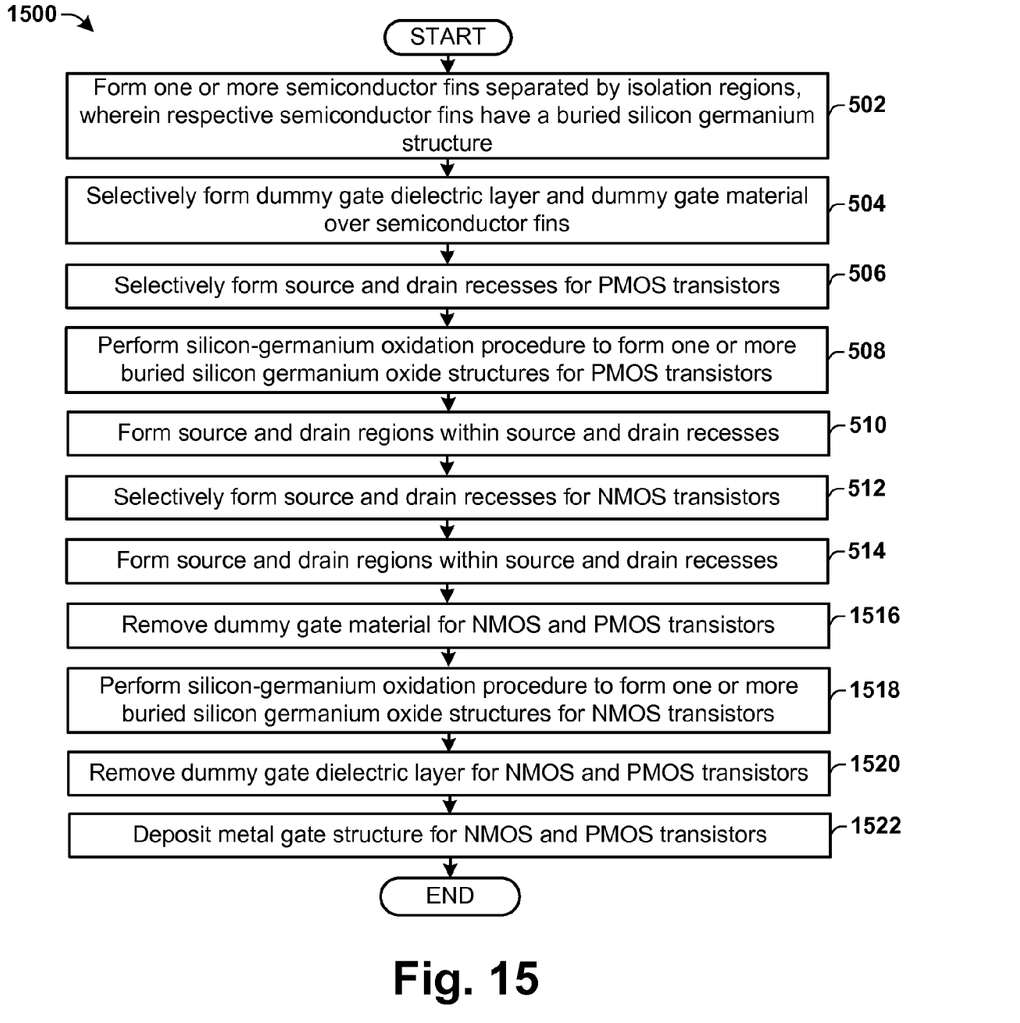
FIG. 15 illustrates a flow chart of some embodiments of an alternative method of forming a FinFET device having a buried silicon germanium oxide structure.

FIG. 15 illustrates a flow chart of some embodiments of an alternative method 1500 of forming NMOS and PMOS FinFET devices having buried silicon germanium structures.

At 502, one or more fins of semiconductor material, respectively comprising an epitaxially grown buried silicon germanium structure, are formed onto a substrate.

At 504, a dummy gate dielectric layer and dummy gate material are selectively formed over the semiconductor fins.

At 506, source and drain recesses are selectively formed in the three-dimensional fins for PMOS transistors.

At 508, a silicon-germanium oxidation procedure is performed for PMOS transistors. The silicon germanium oxidation procedure causes the buried silicon germanium structure to be oxidized to form one or more buried silicon germanium oxide structures within PMOS transistors.

At 510, source and drain regions are formed within source and drain recesses.

At 512, source and drain recesses are selectively formed in the three-dimensional fins for NMOS transistors.

At 514, source and drain regions are formed within source and drain recesses.

At 1516, the dummy gate material is removed for NMOS and PMOS transistors.

At 1518, a silicon-germanium oxidation procedure is performed for NMOS transistors. The silicon germanium oxidation procedure causes the buried silicon germanium structure to be oxidized to form one or more buried silicon germanium oxide structures within NMOS transistors.

At 1520, the dummy gate dielectric layer is removed for NMOS transistors.

At 1522, a metal gate structure is selectively deposited for NMOS transistors.

FIGS. 16A-18B illustrate some embodiments of a semiconductor substrate upon which a method of forming NMOS and PMOS FinFET devices having buried silicon germanium structures, according to the method of FIG. 15, is performed. FIGS. 16A-18B correspond to acts 1516-1522. The figures ending with a suffix of A relate to the formation of an NMOS FinFET, while the figures ending with a suffix B relate to the formation of a PMOS FinFET.

Figure 16A:
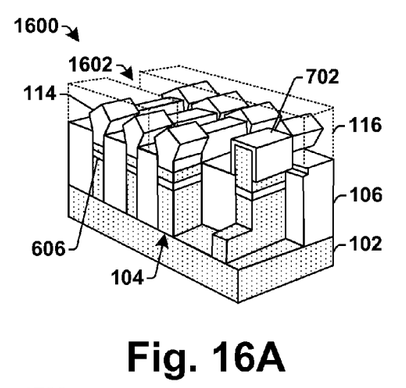
Figure 16B:
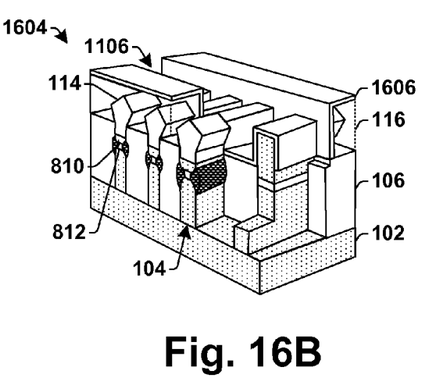

FIGS. 16A-16B illustrates cross-sectional views, 1600 and 1604, of some embodiments of a substrate corresponding to act 1516.

As shown in cross-sectional views, 1600 and 1604, an inter-level dielectric (ILD) layer 116 is formed onto the substrate. In some embodiments the ILD layer 116 may comprise an oxide, a low-k dielectric material, or an ultra low-k dielectric material.

As shown cross-sectional 1600, the dummy gate material 802 and the dummy gate dielectric layer 704 are removed forming a recess 1602. In various embodiments, the dummy gate material 802 and the dummy gate dielectric layer 704 are removed by a wet chemical etch and/or a dry chemical etch, which utilize an isotropic etch profile.

As shown in cross-sectional 1604, a third hard mask layer 1606 is formed over the PMOS transistor. In some embodiments, the third hard mask layer 1606 may comprise silicon nitride (SiN). The third hard mask layer 1606 prevents processing of the PMOS transistor.

Figure 17A:
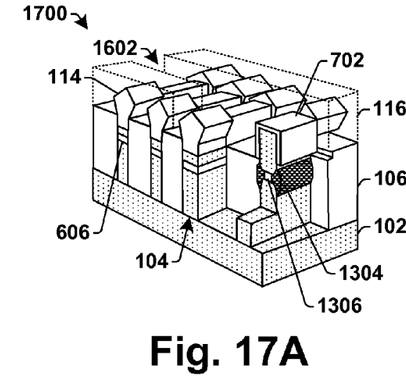
Figure 17B:
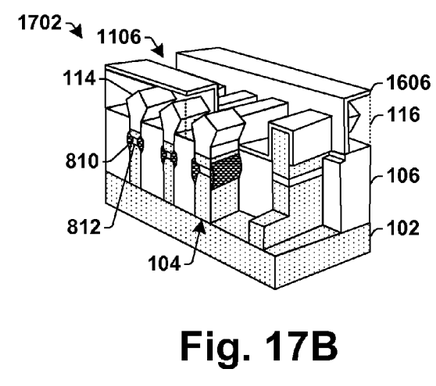

FIGS. 17A-17B illustrate cross-sectional views, 1700 and 1702, of some embodiments of a substrate corresponding to act 1518.

As shown in cross-sectional views 1700, a silicon-germanium oxidation procedure is performed for NMOS transistors to form a buried silicon germanium oxide structure 1304. In some embodiments, the oxidation process comprises a wet oxidation process in an environment having an $H_2O$ steam. In some embodiments, the $H_2O$ steam comprises a water vapor pressure having a range of between approximately 1 atmosphere and approximately 20 atmosphere. The wet oxidation process may be performed at a temperature of between approximately 400° C. and approximately 600° C. for a time of between approximately 10 minutes and approximately 60 minutes. Depending on the oxidation procedure, in some embodiments, the buried silicon germanium oxide structure 1304 comprises sections of silicon germanium oxide separated by a buried silicon germanium structure 1306.

Figure 18A:
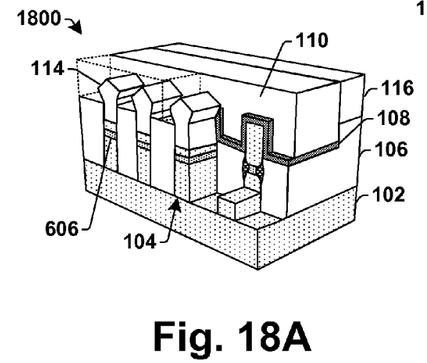
Figure 18B:
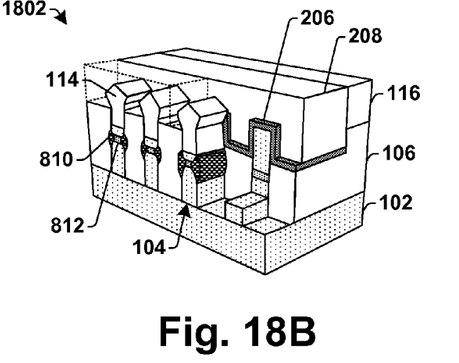

As shown in cross-sectional views 1702 the third hard mask layer 1102 prevents processing of the PMOS transistor FIGS. 18A-18B illustrates cross-sectional views, 1800 and 1804, of some embodiments of a substrate corresponding to acts 1520-1522.

As shown in cross-sectional 1800, a gate dielectric layer 108 and a gate material layer 110 are formed within recesses 1106 and 1602. The gate material layer 110 may be formed by way of a multi step deposition process that forms a first gate material layer and then a second gate material layer. A first chemical mechanical polishing process may be performed after formation of the gate dielectric layer 108 and a gate material layer 110 to remove excess of the gate material layer 110 from the substrate.

A chemical mechanical polishing process may be performed after formation of the gate dielectric layer 108 and a gate material layer 110 to remove excess of the gate material layer 110 from the substrate. Since method 1500 uses a same chemical mechanical polishing process for NMOS and PMOS transistors, a height of the PMOS metal gate structure is substantially equal to a height of the NMOS metal gate structure.

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs.

Also, equivalent alterations and/or modifications may occur to one of ordinary skill in the art based upon a reading and/or understanding of the specification and annexed drawings. The disclosure herein includes all such modifications and alterations and is generally not intended to be limited thereby.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a Fin field effect transistor (FinFET) device having a buried silicon germanium oxide structure configured to enhance performance of the FinFET device In some embodiments, the present disclosure relates to a Fin field effect transistor (FinFET) device. The FinFET device comprises a three-dimensional fin of semiconductor material protruding from a substrate at a location between first and second isolation regions. The FinFET device further comprises a gate structure overlying the three-dimensional fin of semiconductor material and configured to control a flow of charge carriers within the three-dimensional fin of semiconductor material. The FinFET device further comprises a buried epitaxial oxide structure disposed within the three-dimensional fin of semiconductor material at a position extending between the first and second isolation regions.

In other embodiments, the present disclosure relates to a Fin field effect transistor (FinFET) device. The FinFET device comprises a three-dimensional fin of semiconductor material protruding from a substrate at a location between first and second isolation regions. The FinFET device further comprises a gate structure overlying the three-dimensional fin of semiconductor material and configured to control a flow of charge carriers within the three-dimensional fin of semiconductor material. The FinFET device further comprises a source region located on a first side of the gate structure and in electrical contact with the three-dimensional fin of semiconductor material. The FinFET device further comprises a drain region located on a second side of the gate structure opposite the first side and in electrical contact with the three-dimensional fin of semiconductor material. The FinFET device further comprises one or more buried silicon germanium oxide structure disposed within the three-dimensional fin of semiconductor material at a position between an upper portion of the three-dimensional fin of semiconductor material and a lower portion of the three-dimensional fin of semiconductor material In other embodiments, the present disclosure relates to a method of forming a Fin field effect transistor (FinFET) device. The method comprises forming one or more fins of semiconductor material on a semiconductor substrate between isolation regions, wherein the fins of semiconductor material comprise a buried silicon germanium structure. The method further comprises oxidizing the buried silicon germanium structure to form one or more buried silicon germanium oxide structures. The method further comprises forming a gate structure protruding from the substrate at a position overlying the one or more fins of semiconductor material, wherein the gate structure comprises a gate dielectric layer and a gate material layer. The method further comprises forming a source region and a drain region on opposite ends of the gate structure at positions that electrically contact the one or more fins of semiconductor material.

What is claimed is:

1. A Fin field effect transistor (FinFET) device, comprising:
   a three-dimensional fin of semiconductor material protruding from a substrate at a location between first and second isolation regions;
   a gate structure overlying the three-dimensional fin of semiconductor material and configured to control a flow of charge carriers within the three-dimensional fin of semiconductor material;
   a buried epitaxial structure disposed within the three-dimensional fin of semiconductor material at a position extending between the first and second isolation regions in a first lateral direction; and
   a buried epitaxial oxide structure disposed within the three-dimensional fin of semiconductor material at a position between the first and second isolation regions, wherein the buried epitaxial oxide structure has a sidewall that laterally contacts the buried epitaxial structure in a second lateral direction perpendicular to the first lateral direction.

2. The FinFET device of claim 1, wherein the buried epitaxial oxide structure comprises a buried silicon germanium oxide structure.

3. The FinFET device of claim 2,
   wherein the buried silicon germanium oxide structure is disposed along a first direction between an upper portion of the three-dimensional fin and a lower portion of the three-dimensional fin; and
   wherein the buried silicon germanium oxide structure is disposed along a second direction, perpendicular to the first direction, between the first and second isolation regions.

4. The FinFET device of claim 2, wherein the buried silicon germanium oxide structure extends as a bulge outward from a first sidewall of the three-dimensional fin and outward from a second sidewall of the three-dimensional fin, opposite the first sidewall, to a distance of between approximately 1 nm (nanometer) and approximately 5 nm.

5. The FinFET device of claim 4, wherein the buried silicon germanium oxide structure extends continuously between the first sidewall and the second sidewall.

6. The FinFET device of claim 4, wherein the buried silicon germanium oxide structure is discontinuous between the first sidewall and the second sidewall.

7. The FinFET device of claim 1, wherein the FinFET device comprises a PMOS transistor having the buried epitaxial oxide structure disposed at a position underlying a source region and a drain region.

8. The FinFET device of claim 7, wherein the FinFET device comprises an NMOS transistor having the buried epitaxial oxide structure disposed at a position underlying the gate structure.

9. The FinFET device of claim 8, wherein the gate structure within the NMOS transistor has a first gate height and wherein the gate structure within the PMOS transistor has second gate height that is less than first gate height.

10. The FinFET device of claim 1, wherein the buried epitaxial structure is disposed along a first direction between an upper portion of the three-dimensional fin and a lower portion of the three-dimensional fin;
    wherein the buried epitaxial structure is disposed along a second direction, perpendicular to the first direction, between the first and second isolation regions;
    wherein the buried epitaxial oxide structure is disposed along a first direction between an upper portion of the three-dimensional fin and a lower portion of the three-dimensional fin; and
    wherein the buried epitaxial oxide structure is disposed along a second direction, perpendicular to the first direction, between the first and second isolation regions.

11. A Fin field effect transistor (FinFET) device, comprising:
    a three-dimensional fin comprising a first semiconductor material protruding from a substrate at a location between first and second isolation regions;
    a gate structure overlying the three-dimensional fin and configured to control a flow of charge carriers within the three-dimensional fin;
    a buried epitaxial structure comprising a second material disposed within the three-dimensional fin at a first position vertically between an upper portion of the three dimensional fin and a lower portion of the three dimensional fin and laterally between the first and second isolation regions; and
    a buried epitaxial-oxide structure comprising a third material disposed within the three-dimensional fin at a second position vertically between the upper portion of the three-dimensional fin and the lower portion of the three-dimensional fin and laterally between the first and second isolation regions, wherein the buried epitaxial oxide structure protrudes vertically to locations above and below the buried epitaxial structure.

12. The FinFET device of claim 11, wherein the FinFET device comprises a PMOS transistor having the buried epitaxial oxide structure disposed at a position underlying a source region and a drain region.

13. The FinFET device of claim 11, wherein the FinFET device comprises an NMOS transistor having the buried epitaxial oxide structure disposed at a position underlying the gate structure.

14. The FinFET device of claim 11, wherein the buried epitaxial structure comprises a second material that is a different material than the first semiconductor material.

15. The FinFET device of claim 14, wherein the buried epitaxial oxide structure has a sidewall that laterally contacts the buried epitaxial structure.

16. The FinFET device of claim 11, wherein the buried epitaxial oxide structure has a first height that is greater than a second height of the buried epitaxial structure.

17. An integrated chip, comprising:
    a three-dimensional fin of semiconductor material protruding from a substrate;
    a buried epitaxial oxide structure disposed within the three-dimensional fin of semiconductor material at a position vertically between an upper portion of the three-dimensional fin of semiconductor material and a lower portion of the three-dimensional fin of semiconductor material, and laterally protruding outward past sidewalls of the three-dimensional fin of semiconductor material;
    a gate structure overlying the three-dimensional fin of semiconductor material;
    a source region and a drain region arranged on opposing sides of the gate structure;
    a second three-dimensional fin of semiconductor material protruding from the substrate;
    a second buried epitaxial oxide structure disposed within the second three-dimensional fin of semiconductor material; and a second gate structure overlying the second three-dimensional fin of semiconductor material and having a second height that is less than a first height of the gate structure.

18. The integrated chip of claim 17, further comprising:
a buried epitaxial structure disposed within the three-dimensional fin at a position that laterally abuts the buried epitaxial oxide structure.

19. The integrated chip of claim 18,
wherein the buried epitaxial oxide structure comprises silicon germanium oxide oxide structures arranged under the source region and the drain region and the buried epitaxial structure comprises a silicon germanium structure arranged under the gate structure; or
wherein the buried epitaxial oxide structure comprises a silicon germanium oxide structure arranged under the gate structure and the buried epitaxial structure comprises silicon germanium structures arranged under the source region and the drain region.

20. The integrated chip of claim 17, wherein the buried epitaxial oxide structure and the three-dimensional fin of semiconductor material vertically overlap so that the buried epitaxial oxide structure is laterally adjacent to the lower portion and the upper portion of the three-dimensional fin of semiconductor material.

* * * * *